United States Patent
Moriyama et al.

(10) Patent No.: US 6,759,314 B1
(45) Date of Patent: Jul. 6, 2004

(54) METHOD FOR MANUFACTURING SEMICONDUCTOR DEVICES USING THERMAL NITRIDE FILMS AS GATE INSULATING FILMS

(75) Inventors: Wakako Moriyama, Yokohama (JP); Naoki Kai, Chigasaki (JP); Hiroaki Hazama, Hachioji (JP); Keiki Nagai, Tokyo (JP); Yuji Fukazawa, Yokohama (JP); Kazuo Saki, Yokohama (JP); Yoshio Ozawa, Yokohama (JP); Yasumasa Suizu, Oita (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 3 days.

(21) Appl. No.: 09/670,520

(22) Filed: Sep. 26, 2000

(30) Foreign Application Priority Data

Sep. 27, 1999 (JP) .......................................... 11-272322

(51) Int. Cl.[7] ............................................ H01L 21/425
(52) U.S. Cl. ...................... 438/517; 438/201; 438/591; 438/593; 438/680; 438/681; 438/769; 438/770; 438/786; 257/314; 257/390
(58) Field of Search .............................. 438/517, 195, 438/201, 680, 681, 769, 770, 786, 128, 211, 591–593, 253, 257, 574, 579, 276, 278; 257/314–315, 390, 331

(56) References Cited

U.S. PATENT DOCUMENTS

| | | | | | |
|---|---|---|---|---|---|
| 4,409,723 A | * | 10/1983 | Harari | ........................ | 29/571 |
| 4,789,560 A | * | 12/1988 | Yen | .............................. | 427/96 |
| 5,151,375 A | * | 9/1992 | Kazerounian et al. | ........ | 437/43 |
| 5,327,378 A | * | 7/1994 | Kazerounian | ............... | 365/185 |
| 5,587,332 A | * | 12/1996 | Chang et al. | ................ | 437/43 |
| 5,663,084 A | * | 9/1997 | Yi et al. | ..................... | 438/453 |
| 5,698,262 A | * | 12/1997 | Soubeyrand et al. | ... | 427/255.19 |
| 5,880,498 A | * | 3/1999 | Kinoshita et al. | .......... | 257/315 |
| 6,037,221 A | * | 3/2000 | Lee et al. | ................... | 438/257 |
| 6,063,662 A | * | 5/2000 | Bui | ............................ | 438/257 |
| 6,093,604 A | * | 7/2000 | Jeong | ......................... | 438/257 |
| 6,100,559 A | * | 8/2000 | Park | ........................... | 257/315 |
| 6,153,469 A | * | 11/2000 | Yun et al. | ................... | 438/257 |
| 6,255,167 B1 | * | 7/2001 | Wu | ............................ | 438/259 |
| 6,335,549 B1 | * | 1/2002 | Kusunoki et al. | .......... | 257/231 |
| 6,380,029 B1 | * | 4/2002 | Chang et al. | ............... | 438/257 |
| 2001/0040252 A1 | * | 11/2001 | Kobayashi et al. | ......... | 257/314 |
| 2001/0046738 A1 | * | 11/2001 | Au et al. | .................... | 438/261 |

FOREIGN PATENT DOCUMENTS

| | | | |
|---|---|---|---|
| JP | 1-134936 | 5/1989 | |
| JP | 9-115904 | 5/1997 | |
| JP | 09-306790 | * 11/1997 | ............ H01G/9/04 |
| JP | 10-284626 | 10/1998 | |
| JP | 10-321740 | 12/1998 | |
| JP | 11-97683 | 4/1999 | |
| JP | 11-154711 | 6/1999 | |
| JP | 11-224940 | 8/1999 | |
| JP | 2000-12710 | 1/2000 | |
| JP | 2001-85680 | 3/2001 | |

OTHER PUBLICATIONS

Rama et al. "Growth and surface chemistry of oxynitride gate dielectric using nitric oxide" Appl. Phys. Lett vol. 66 #21 May 1995 p. 2882–84.*

* cited by examiner

Primary Examiner—Matthew Smith
Assistant Examiner—Granvill Lee
(74) Attorney, Agent, or Firm—Oblon, Spivak, McClelland, Maier & Neustadt, P.C.

(57) ABSTRACT

A thermal nitride film is formed as a gate insulating film on a silicon substrate, and after a gate electrode material is formed on the insulating film, it is patterned to form gate electrodes. After processing the electrodes, part of the gate insulating film other than a portion thereof which lies under the gate electrodes is removed. Further, an insulating film (a post oxidation film) is formed on side walls and upper surfaces of the stacked gate structures and the exposed main surface of the silicon substrate by use of thermal oxidation method.

15 Claims, 21 Drawing Sheets

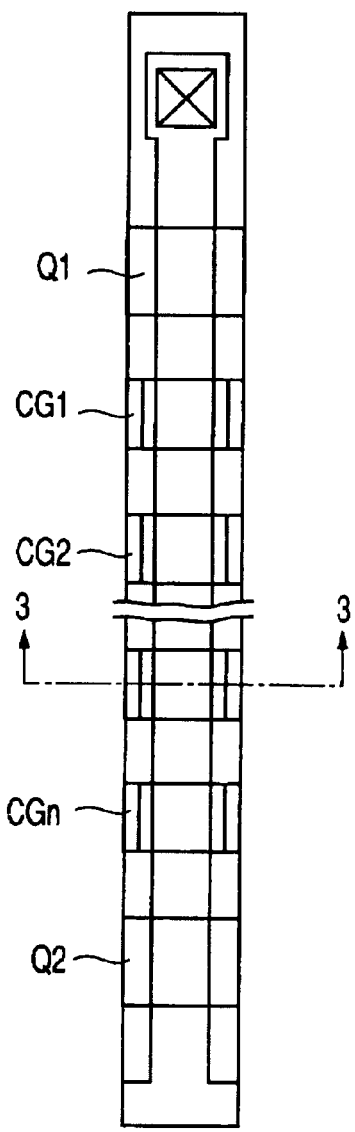 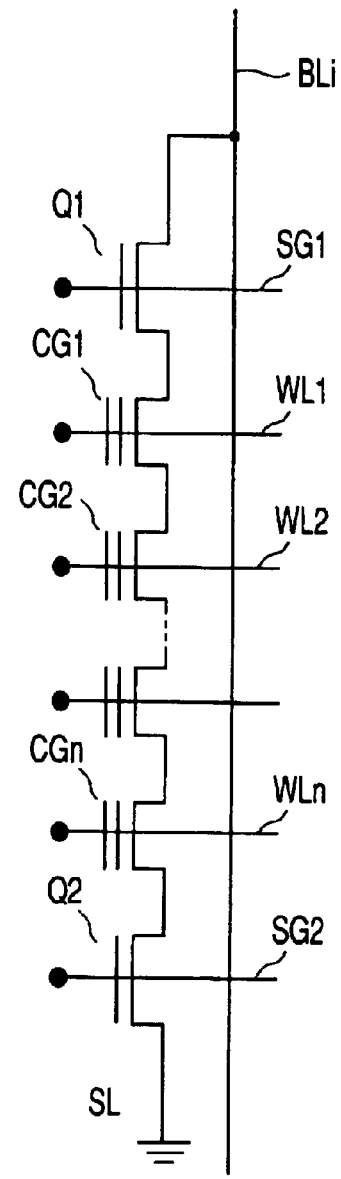
FIG. 1 (PRIOR ART)
FIG. 2 (PRIOR ART)

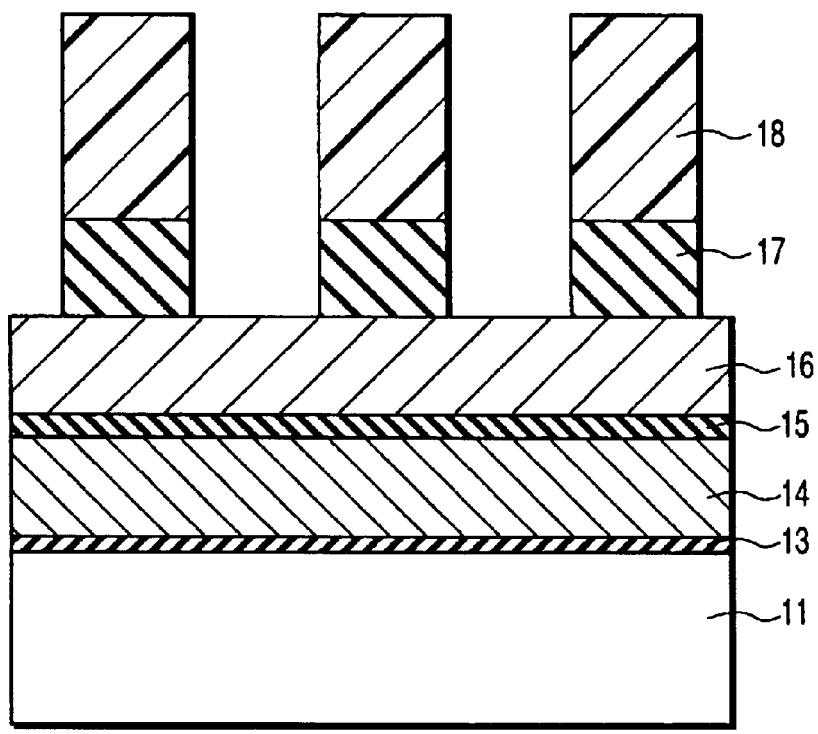
F I G. 5D
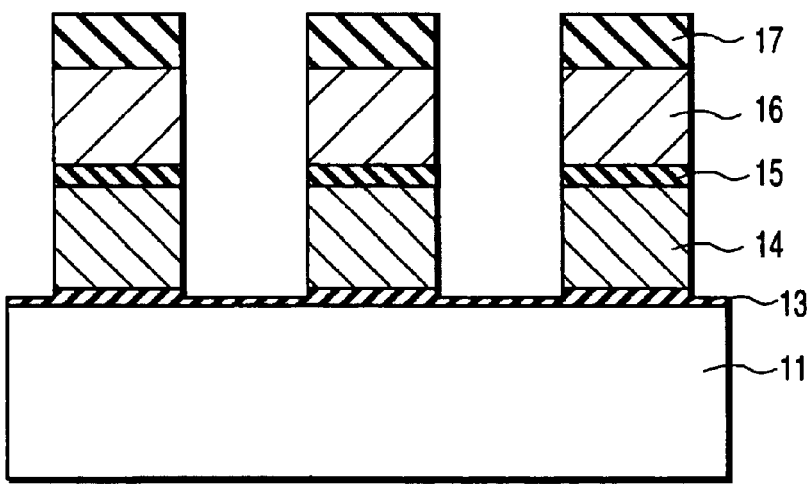
F I G. 5E

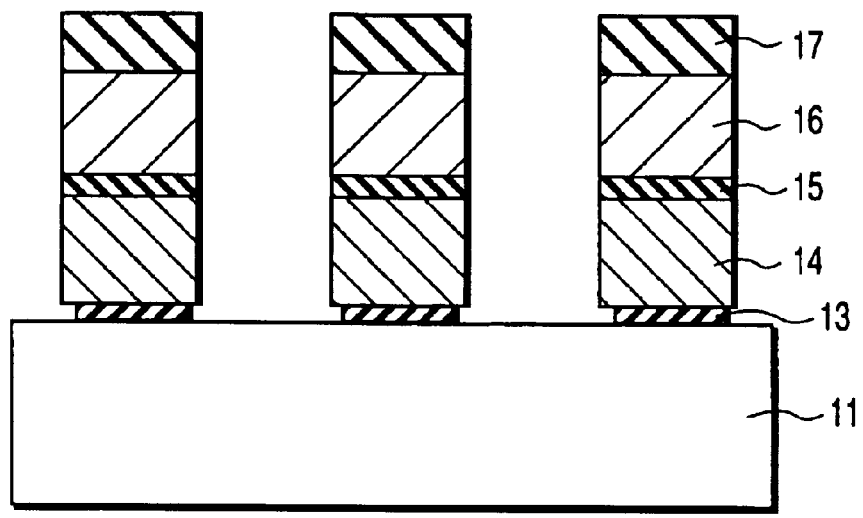
F I G. 7F
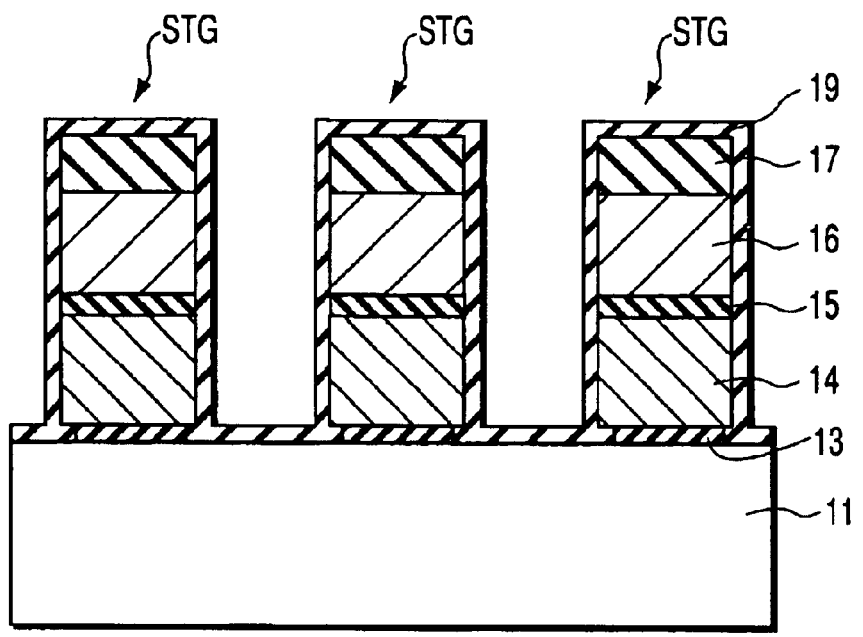
F I G. 7G

F I G. 10A
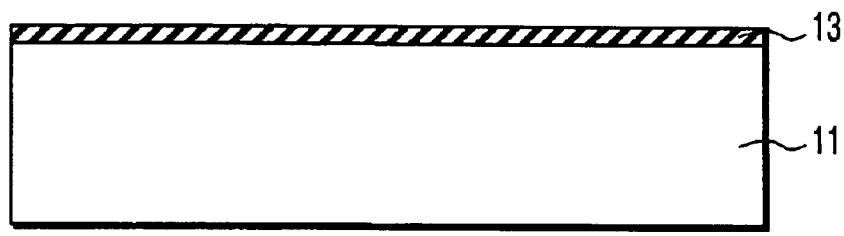
F I G. 10B
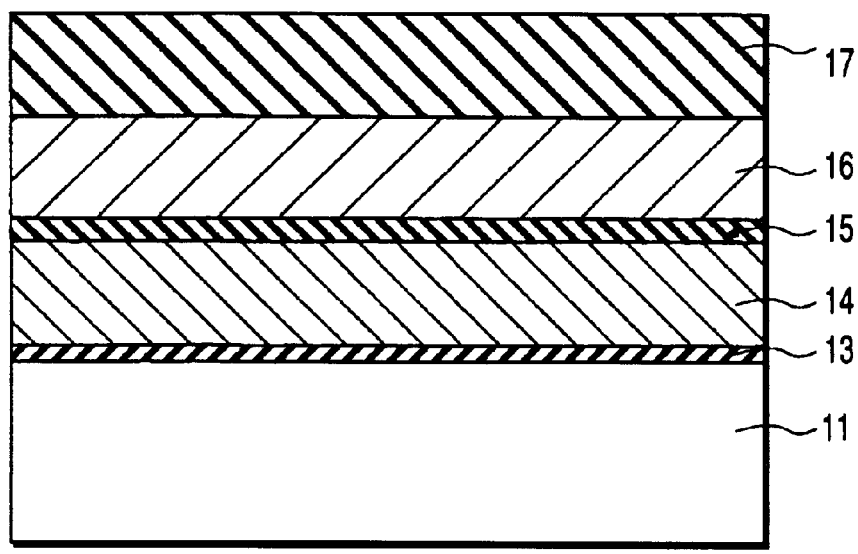
F I G. 10C

METHOD FOR MANUFACTURING SEMICONDUCTOR DEVICES USING THERMAL NITRIDE FILMS AS GATE INSULATING FILMS

CROSS-REFERENCE TO RELATED APPLICATIONS

This application is based upon and claims the benefit of priority from the prior Japanese Patent Application No. 11-272322, filed Sept. 27, 1999, the entire contents of which are incorporated herein by reference.

BACKGROUND OF THE INVENTION

This invention relates to a method for manufacturing semiconductor devices such as nonvolatile memories or MOS transistors using thermal nitride films as gate insulating films and more particularly to a method for manufacturing cell transistors of a NAND cell type EEPROM (Electrically Erasable and Programmable Read-Only Memory).

FIG. 1 is a pattern plan view showing the memory cell structure of a NAND cell type EEPROM (NAND cell type flash memory) and FIG. 2 shows the equivalent circuit thereof. As shown in FIGS. 1 and 2, the current paths of a plurality of cell transistors CG1 to CGn which are each formed of an n-channel MOSFET having a stacked gate structure including a floating gate and control gate are serially connected. The drain of the cell transistor CG1 which is disposed on one end side of the current paths is connected to a bit line BLi (i=1, 2, . . .) via the current path of a selection n-channel MOS transistor Q1 and the source of the cell transistor CGn which is disposed on the other end side of the current paths is connected to a source line (ground potential) SL via the current path of a selection n-channel MOS transistor Q2. The transistors GC1 to CGn, Q1, Q2 are formed in the same well region. The control gates of the cell transistors CG1 to CGn are connected to word lines WL1 to WLn which are each continuously formed in the row direction and the gates of the selection transistors Q1, Q2 are respectively connected to selection lines SG1, SG2. Further, one-side ends of the respective word lines WL1 to WLn are connected to connection pads for connection with a peripheral circuit via Al wirings. The connection pads are formed on an element isolation region.

Next, the outline of the manufacturing method of the cell transistors of the NAND cell type flash memory is explained with reference to FIGS. 3A to 3G corresponding to a cross section taken along the 3—3 line of the pattern plan view of FIG. 1.

First, a silicon oxide film 2 with a film thickness of 7 nm is formed on a silicon substrate 1 by use of the thermal oxidation method (FIG. 3A).

Then, an oxynitride film 3 is formed by nitrifying the silicon oxide film 2 by use of $NH_3$ gas and then oxidizing the same (FIG. 3B). The oxynitride film 3 acts as a first gate insulating film and is generally called a tunnel oxide film.

Next, a polysilicon film 4 with a film thickness of 200 nm having phosphor doped therein as impurity is formed on the oxynitride film 3 by use of the LPCVD method. The polysilicon film 4 is used as a first gate electrode. Generally, the polysilicon film 4 is called a floating gate. Then, a second gate insulating film 5 with a film thickness of 120 nm is formed on the floating gate 4 by use of the LPCVD method. After this, a polysilicon film 6 having phosphor doped therein as impurity is formed on the second insulating film 5 by use of the LPCVD method. The polysilicon film 6 is used as a second gate electrode and it is generally called a control gate. Then, an oxide film 7 is formed on the polysilicon film 6 by use of the LPCVD method (FIG. 3C).

Further, a photoresist 8 is coated on the oxide film 7 and the oxide film 7 is processed into a desired pattern by use of the photoetching method (FIG. 3D).

Next, the photoresist 8 is removed. The etching process is effected in a direction perpendicular to the main surface of the silicon substrate 1 by use of a dry etching method such as an RIE (Reactive Ion Etching) method with the patterned oxide film 7 used as a mask so as to sequentially form control gate 6, second gate insulating films 5 and floating gates 4 (FIG. 3E).

Then, in order to suppress the leak current in the end portion of the gate electrode, enhance the surface withstand voltage of high breakdown voltage MOS transistors of the peripheral circuit, that is, the withstand voltages of the gate insulating films 5, 3 and eliminate the damage caused by ions doped into the gate oxide films 5, 3 via the gate electrodes 6, 4 in the RIE process, a silicon oxide film 9 is formed by use of a thermal oxidation method (FIG. 3F). Generally, the above oxidation process is called a post oxidation process and the oxide film 9 formed at this time is called a post oxidation film.

After the post oxidation film 9 is formed, impurity is doped into the silicon substrate 1 by an ion-implantation process with the stacked gate structures STG of the control gates 6 and floating gates 4 used as a mask so as to form source and drain regions 10 and then the doped impurity is activated by annealing to form cell transistors (FIG. 3G).

However, since the nitrogen concentration in the tunnel oxide film is high if the oxynitride film 3 is used as the tunnel oxide film as described above, it becomes difficult to form the post oxidation film 9. Therefore, the damage caused in the tunnel oxide film 3 in the RIE process cannot be eliminated. Further, as shown by an enlarged portion in FIG. 4, the neighboring portion of the edge of the floating gate 4 is not oxidized and is formed in a sharpened shape.

In a flash memory, a state in which electrons exist in the floating gate 4 corresponds to a programmed state "0" and a state in which electrons do not exist in the floating gate 4 corresponds to an erase state "1". Since electrons pass through the tunnel oxide film 3 in both directions to set up the programmed state and erase state, some electrons are trapped in the tunnel oxide film 3 to reduce a current amount if a damage D occurring in the RIE process is kept left in the tunnel oxide film 3. Further, if a portion of the floating gate 4 is not oxidized at the time of post oxidation and is left behind with the corner portion sharpened, an electric field is concentrated on the above portion and degradation of the tunnel oxide film 3 will occur more rapidly.

As described above, in the conventional semiconductor device manufacturing method, the damage of the gate insulating film 3 caused at the etching time of the control gates 6 and floating gates 4 cannot be eliminated if the thermal nitride film is used as the first insulating film and there occurs a problem that electrons are trapped in the gate insulating film 3 to reduce a current amount and an electric field is concentrated on part of the gate insulating film 3 to accelerate the degradation thereof.

According to an aspect of the present invention, there is provided a semiconductor device manufacturing method comprising forming a gate insulating film in an oxynitride form on a main surface of a semiconductor substrate;

forming gate electrodes on the gate insulating film; removing the gate insulating film except under the gate electrodes to expose the main surface of the semiconductor substrate; forming an insulating film on the exposed main surface of the semiconductor substrate by at least one of a vaporizer method using $H_2O$ as an oxidizer, an oxyhydrogen combustion method, and a wet oxidation method performed at temperatures not lower than 950° C.; and forming impurity diffused layers on both sides of the respective gate electrodes in the semiconductor substrate.

According to another aspect of the present invention, there is provided a semiconductor device manufacturing method comprising forming a gate insulating film in an oxynitride form on a main surface of a semiconductor substrate; forming gate electrodes on the gate insulating film; making a nitrogen concentration of the gate insulating film except under the gate electrodes lower than a nitrogen concentration of the gate insulating film which lies under the gate electrodes by oxidizing the gate electrodes and the gate insulating film by at least one of a vaporizer method using $H_2O$ as an oxidizer, an oxyhydrogen combustion method, and a wet oxidation method performed at temperatures not lower than 950° C.; and forming impurity diffused layers on both sides of the respective gate electrodes in the semiconductor substrate.

According to still another aspect of the present invention, there is provided a semiconductor device manufacturing method comprising forming a gate insulating film in an oxynitride form on a main surface of a semiconductor substrate; forming gate electrodes on the gate insulating film; forming a post oxidation film on the main surface of the semiconductor substrate except under the gate electrodes by at least one of a vaporizer method using $H_2O$ as an oxidizer, an oxyhydrogen combustion method, ad a wet oxidation method performed at temperatures not lower than 950° C.; oxynitrifying the post oxidation film, and forming impurity diffused layers on both sides of the respective gate electrodes in the semiconductor substrate.

According to still another aspect of the present invention, there is provided a semiconductor device manufacturing method comprising forming a first insulating film in an oxynitride form on a main surface of a semiconductor substrate; forming a first conductive layer on the first insulating film; forming a second insulating film on the first conductive layer; forming a second conductive layer on the second insulating film; forming a third insulating film on the second conductive layer; patterning the third insulating film to form a mask; etching the second conductive layer, second insulating film and first conductive layer with the third insulating film used as a mask to form stacked gate structures each having a control gate, second gate insulating film and floating gate; removing part of the first insulating film which lies on the main surface of the semiconductor substrate and is disposed between the stacked gate structures to expose the main surface of the semiconductor substrate and leave another part of the first insulating film which lies under the stacked gate structures, each part of the first insulating film which is left behind under the stacked gate structures acting as a first gate insulating film; forming a fourth insulating film on side walls and upper surfaces of the stacked gate structures and the exposed main surface of the semiconductor substrate by at least one of a vaporizer method, an oxyhydrogen combustion method, and a wet oxidation method performed at temperatures not lower than 950° C.; and doping impurity into the main surface of the semiconductor substrate with the stacked gate structures used as a mask to form source and drain regions.

According to still another aspect of the present invention, there is provided a semiconductor device manufacturing method comprising forming a first insulating film in an oxynitride form on a main surface of a semiconductor substrate; forming a first conductive layer on the first insulating film; forming a second insulating film on the first conductive layer; forming a second conductive layer on the second insulating film; forming a third insulating film on the second conductive layer; patterning the third insulating film to form a mask; etching the second conductive layer, second insulating film and first conductive layer with the third insulating film used as a mask to form stacked gate structures each having a control gate, second gate insulating film and floating gate, each part of the first insulating film which lies under the stacked gate structures acting as a first gate insulating film; making a nitrogen concentration of the first insulating film which is disposed between the respective stacked gate structures lower than a nitrogen concentration of the first insulating film which lies under the stacked gate structures by oxidizing the stacked gate structures and the first gate insulating film disposed between the respective stacked gate structures by at least one of a vaporizer method, an oxyhydrogen combustion method, and a wet oxidation method performed at temperatures not lower than 950° C.; and doping impurity into the main surface of the semiconductor substrate with the stacked gate structures used as a mask to form source and drain regions.

According to still another aspect of the present invention, there is provided a semiconductor device manufacturing method comprising forming a first insulating film in an oxynitride form on a main surface of a semiconductor substrate; forming a first conductive layer on the first insulating film; forming a second insulating film on the first conductive layer; forming a second conductive layer on the second insulating film; forming a third insulating film on the second conductive layer; patterning the third insulating film to form a mask; etching the second conductive layer, second insulating film and first conductive layer with the third insulating film used as a mask to form stacked gate structures each having a control gate, second gate insulating film and floating gate; removing part of the first insulating film which lies on the main surface of the semiconductor substrate and is disposed between the stacked gate structures to expose the main surface of the semiconductor substrate and leave another part of the first insulating film under the stacked gate structures, each part of the first insulating film which is left behind under the stacked gate structures acting as a first gate insulating film which is left behind under the stacked gate structures acting as a first gate insulating film; forming a post oxidation film on side walls and upper surfaces of the stacked gate structures and the exposed main surface of the semiconductor substrate by at least one of a vaporizer method, an oxyhydrogen combustion method, and a wet oxidation method performed at temperatures not lower than 950° C.; oxynitrifying the post oxidation film; and doping impurity into the main surface of the semiconductor substrate with the stacked gate structures used as a mask to form source and drain regions.

BRIEF DESCRIPTION OF THE SEVERAL VIEWS OF THE DRAWING

FIG. 1 is a pattern plan view showing the memory cell structure of a NAND cell type flash memory;

FIG. 2 is an equivalent circuit diagram of a memory cell in a NAND cell type flash memory;

FIGS. 5A to 5H are cross sectional views sequentially showing the manufacturing steps of cell transistors in a NAND cell type flash memory, for illustrating a method for manufacturing semiconductor devices according to a first embodiment of this invention;

FIGS. 7A to 7I are cross sectional views sequentially showing the manufacturing steps of cell transistors in a NAND cell type flash memory, for illustrating a method for manufacturing semiconductor devices according to a second embodiment of this invention;

FIGS. 10A to 10H are cross sectional views sequentially showing the manufacturing steps of cell transistors in a NAND cell type flash memory, for illustrating a method for manufacturing semiconductor devices according to a fourth embodiment of this invention.

DETAILED DESCRIPTION OF THE INVENTION

[First Embodiment]

FIGS. 5A to 5G are cross sectional views partly and sequentially showing the manufacturing steps of a NAND cell type flash memory, for illustrating a method for manufacturing a semiconductor device according to a first embodiment of this invention and each corresponding to the cross section taken along the 3—3 line of the pattern plan view shown in FIG. 1.

In this embodiment, in a case where an oxynitride film is used as a gate insulating film of each cell transistor in a NAND cell flash memory, the oxynitride film is removed after electrodes (control gates and floating gates) are processed, and then, a post oxidation film is formed.

Figure 3A:
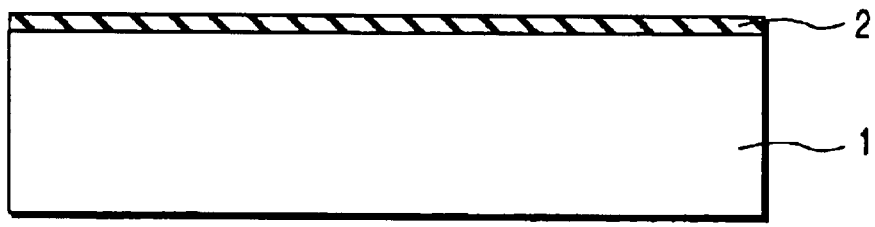
FIGS. 3A to 3G are cross sectional views sequentially showing the manufacturing steps of cell transistors in the NAND cell type flash memory, for illustrating a conventional method for manufacturing a semiconductor device.
Figure 3B:
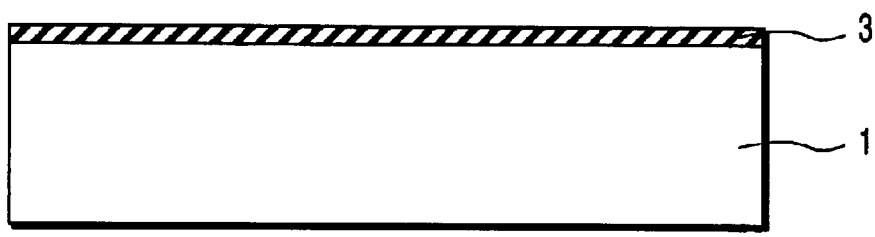
Figure 3C:
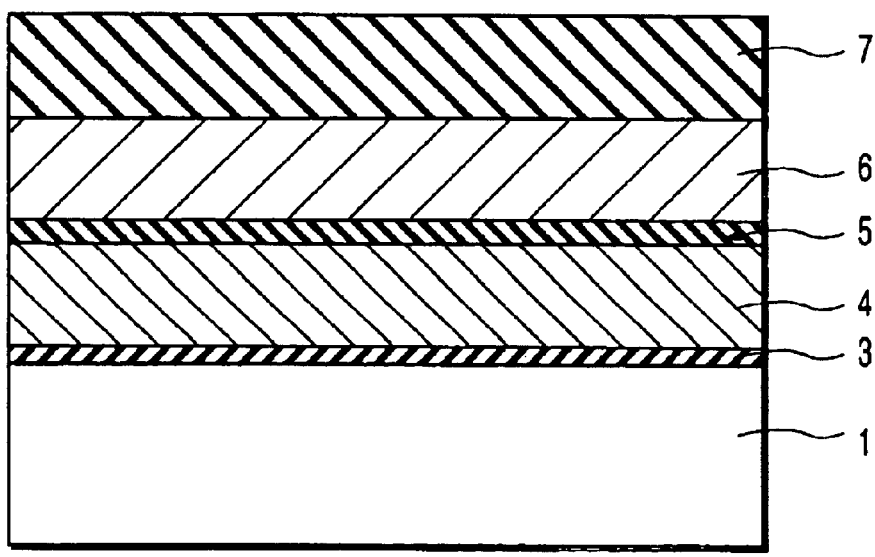
Figure 3D:
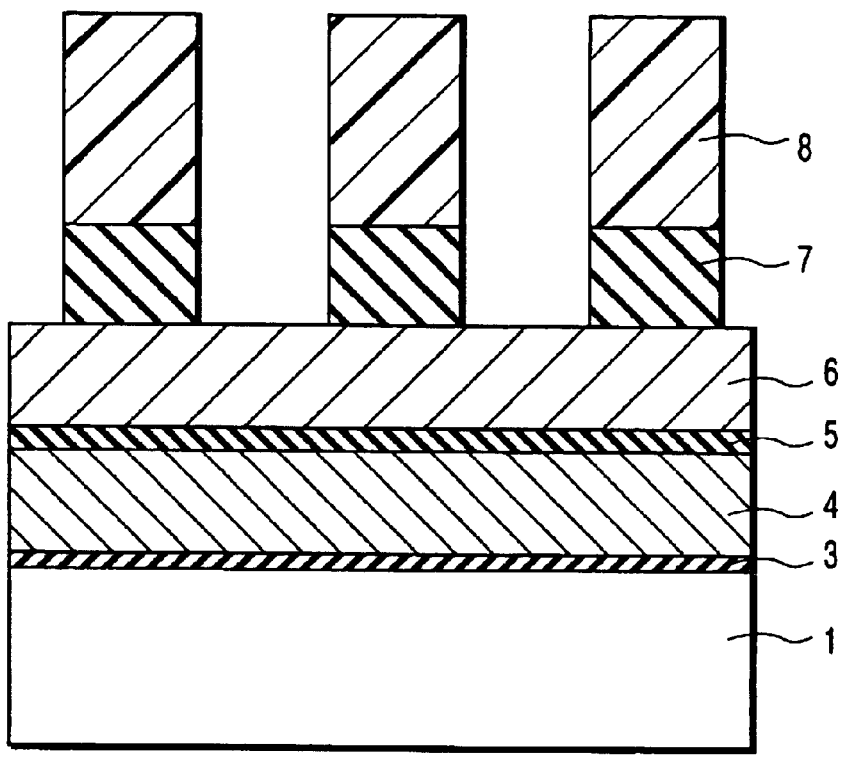
Figure 3E:
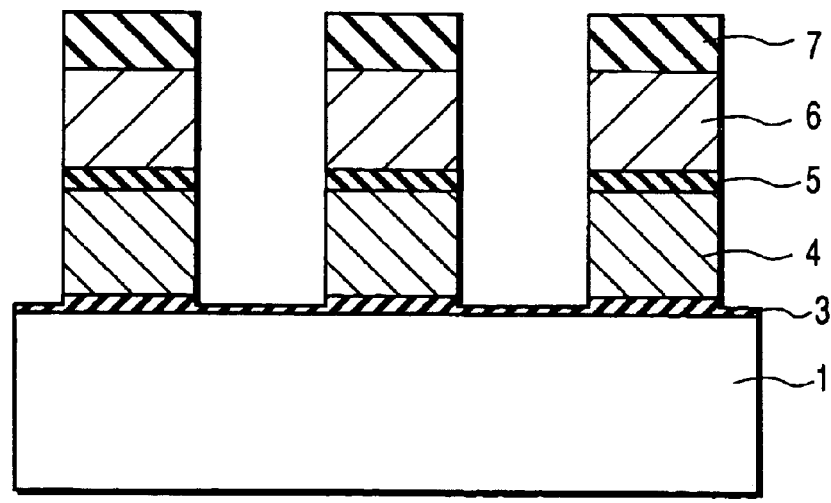
Figure 3F:
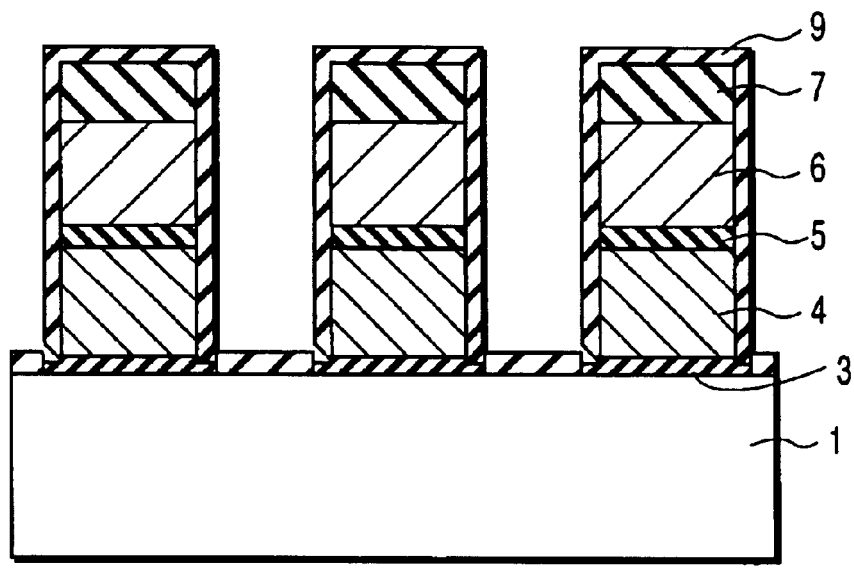
Figure 3G:
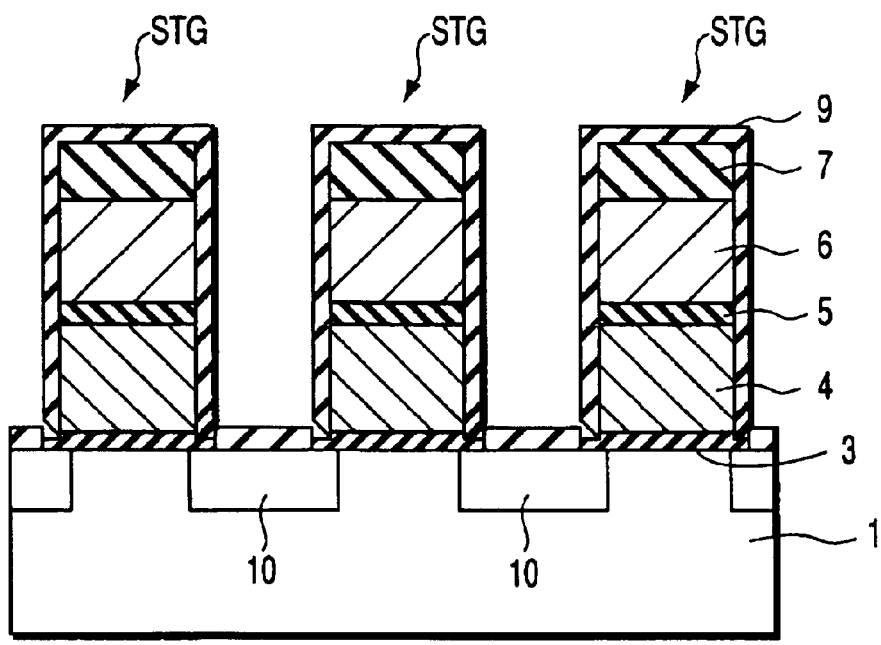
Figure 4:
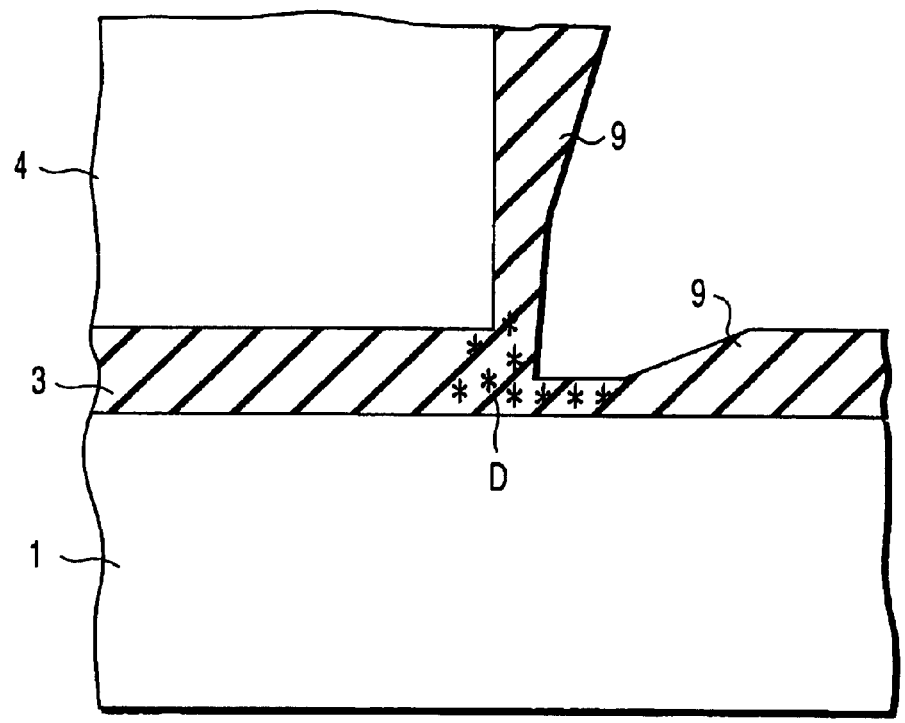
FIG. 4 is a cross sectional view showing an enlarged portion of a neighboring portion of the floating gate in the cell transistor in a case where the cell transistor is formed by use of the conventional manufacturing process.
Figure 5A:

First, a silicon oxide film 12 with a film thickness of 7 mm, for example, is formed on a silicon substrate (semiconductor substrate) 11 by use of the thermal oxidation method (FIG. 5A).

Figure 5B:
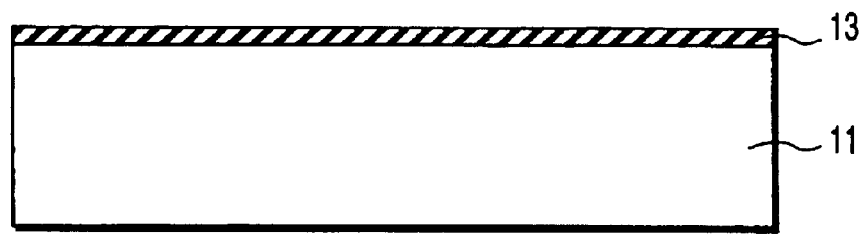

Then, an oxynitride film 13 is formed by nitrifying the silicon oxide film 12 by use of $NH_3$ gas and then oxidizing the same (FIG. 5B). The oxynitride film 13 acts as a first gate insulating film and is generally called a tunnel oxide film.

Figure 5C:
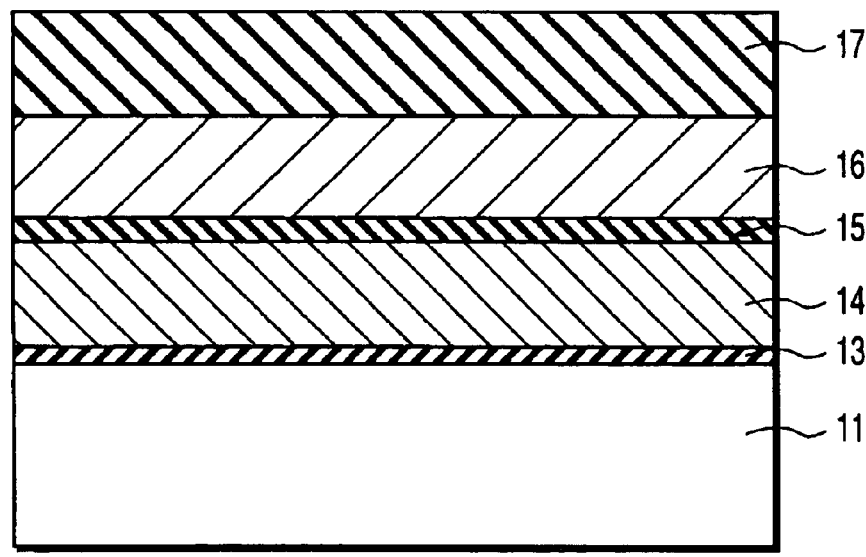

Next, a polysilicon film 14 with a film thickness of 200 nm having phosphor doped therein as impurity is formed on the oxynitride film 13 by use of the LPCVD method. The polysilicon film 14 is used as a first gate electrode. Generally, the polysilicon film 14 is called a floating gate. Then, a second gate insulating film 15 with a film thickness of 120 nm is formed on the polysilicon film 14 by use of the LPCVD method. As the second gate insulating film 15, for example, a single-layered silicon oxide film, a so-called ON structure having a silicon oxide film and silicon nitride film stacked on each other, or an ONO structure having a silicon oxide film, silicon nitride film and silicon oxide film stacked on each other can be used. After this, a polysilicon film 16 having phosphor doped therein as impurity is formed on the second gate insulating film 15 by use of the LPCVD method. The polysilicon film 16 is used as a second gate electrode and generally called a control gate. Then, an oxide film 17 is formed on the polysilicon film 16 by use of the LPCVD method (FIG. 5C).

Further, a photoresist 18 is coated on the oxide film 17 and the oxide film 17 is processed into a desired pattern by use of the photoetching method (FIG. 5D).

Next, the photoresist 18 is removed. The etching process is effected in a direction perpendicular to the main surface of the silicon substrate 11 by use of a dry etching method such as an RIE (Reactive Ion Etching) method with the patterned oxide film 17 used as a mask so as to sequentially form control gates 16, second gate insulating films 15 and floating gates 14 (FIG. 5E).

Figure 5F:
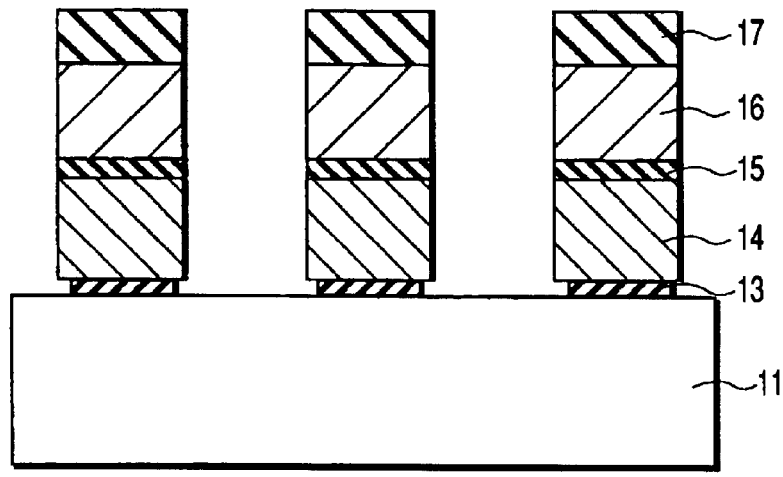

After this, a film with high nitrogen concentration is selectively etched by use of hot phosphoric acid (FIG. 5F). As a result, the oxynitride film 13 is removed except a portion which lies under the floating gates 14 so as to expose the main surface of the silicon substrate 11.

Figure 5G:
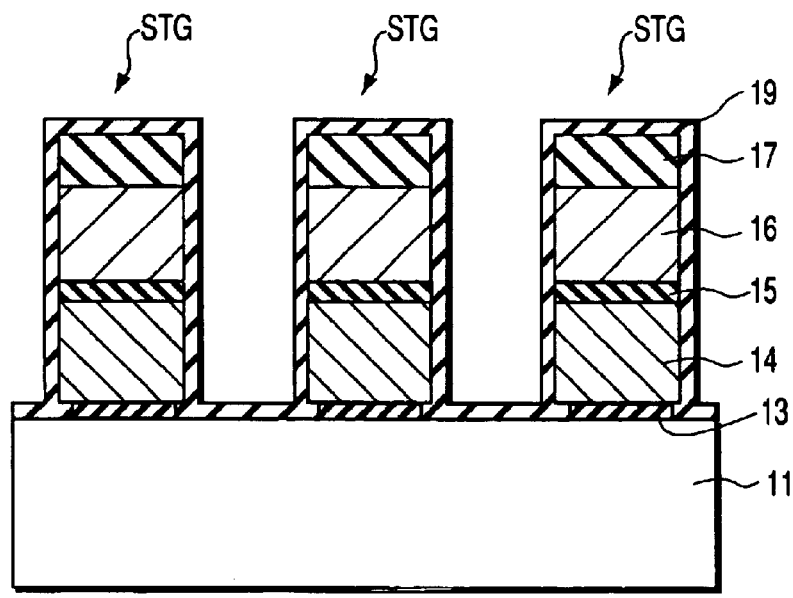

Then, silicon oxide films (post oxidation films) 19 are formed on the exposed main surface of the silicon substrate 11 and the side walls and upper surfaces of the stacked gate structures STG by use of the thermal oxidation method (FIG. 5G).

Figure 5H:
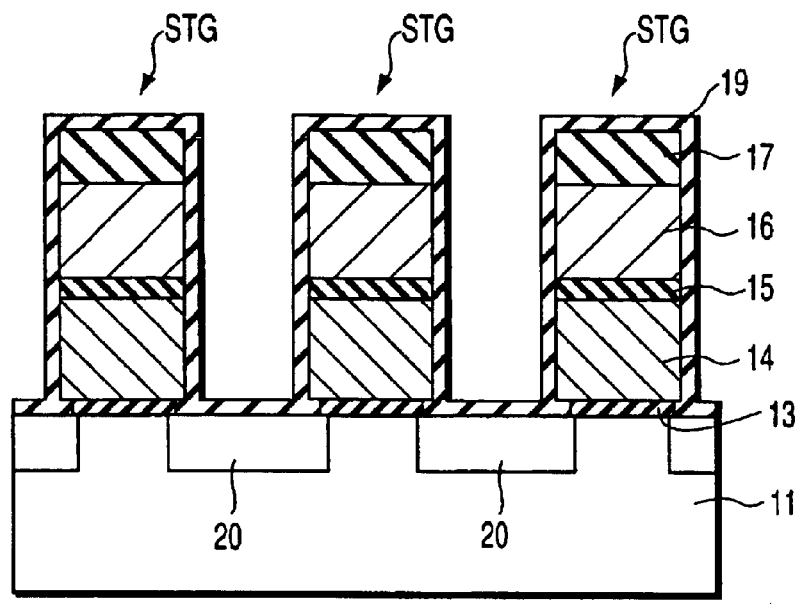

After the post oxidation films 19 are formed, in order to form source and drain regions 20, impurity is ion-implanted into the silicon substrate 11 with the stacked gate structures STG used as a mask and ion-implanted ions are activated by annealing to form cell transistors (FIG. 5H).

Figure 6:
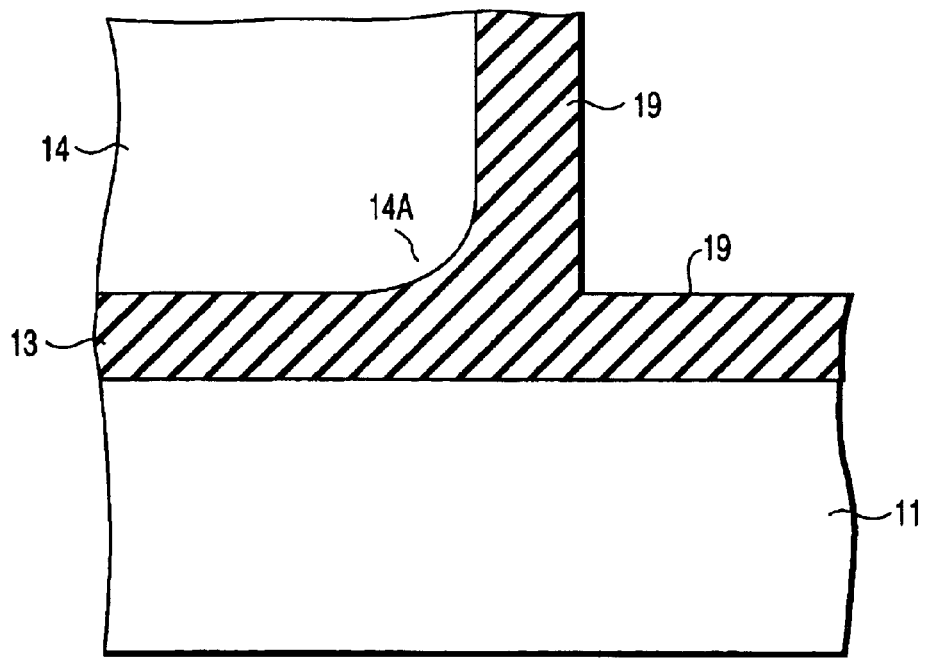
FIG. 6 is a cross sectional view showing an enlarged portion of a neighboring portion of the floating gate in the cell transistor in a case where the cell transistor is formed by use of the manufacturing process according to this invention.

In this embodiment, since the oxynitride film 13 on the source and drain regions (impurity diffused layers) 20 is removed by etching, it becomes easier to form the post oxidation film. As a result, the damage of the gate insulating film 13 caused at the time of processing (etching) of the electrodes such as the control gates 16 and floating gates 14 can be eliminated and an amount of electrons trapped in the gate insulating film 13 can be reduced. As shown in FIG. 6, since an edge portion 14A of the floating gate 14 used as a first gate electrode which lies on the tunnel oxide film (oxynitride film 13) side can be rounded, concentration of the electric field can be suppressed.

Further, in this embodiment, hot phosphoric acid is used to remove the oxynitride film 13, but this is not limitative, and a mixed solution of hydrofluoric acid and glycerol, a mixed solution of hydrofluoric acid and ethylene glycol, a mixed solution of hydrofluoric acid and ethylene glycol mono-ethyl ether or hydrofluoric acid vapor may be used to remove the oxynitride film 13. Further, the oxynitride film 13 can be etched and removed by isotropic etching such as CDE (Chemical Dry Etching) and if the post oxidation film 19 is formed by use of a wet oxidation process, the same effect can be attained.

[Second Embodiment]

FIGS. 7A to 7I are cross sectional views partly and sequentially showing the manufacturing steps of a NAND cell type flash memory, for illustrating a method for manufacturing a semiconductor device according to a second embodiment of this invention and each corresponding to the cross section taken along the 3—3 line of the pattern plan view shown in FIG. 1.

In this embodiment, in a case where an oxynitride film is used as a gate insulating film of each cell transistor in a NAND cell type flash memory, the oxynitride film is removed after electrodes (control gates and floating gates) are processed, then an oxide film is newly formed, and after this, the oxide film is nitrified by use of $NH_3$ gas and then oxidized again to form an oxynitride film.

Figure 7A:
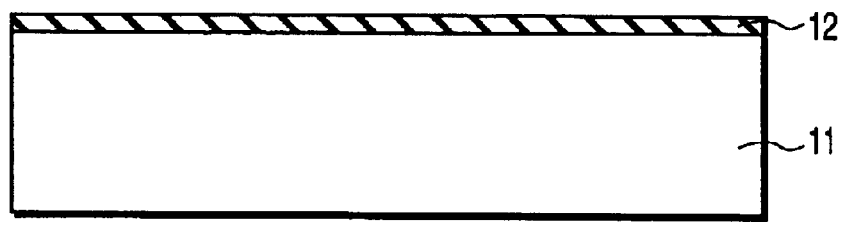

First, a silicon oxide film 12 with a film thickness of 7 nm, for example, is formed on a silicon substrate 11 by use of the thermal oxidation method (FIG. 7A).

Figure 7B:
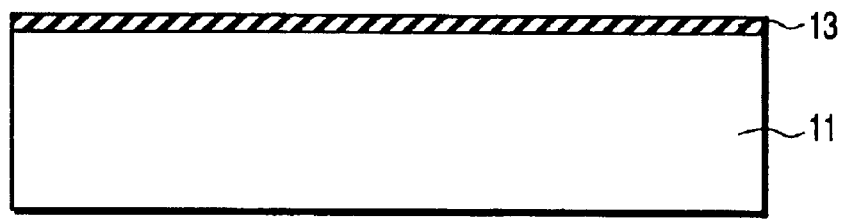

Then, an oxynitride film 13 is formed by nitrifying the silicon oxide film 12 by use of $NH_3$ gas and then oxidizing the same (FIG. 7B). The oxynitride film 13 acts as a first gate insulating film (tunnel oxide film).

Figure 7C:
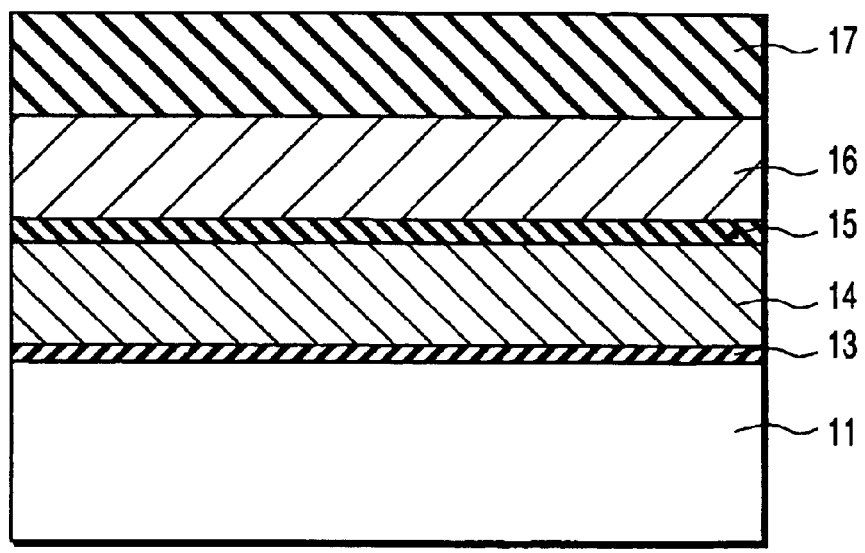

Next, a polysilicon film 14 with a film thickness of 200 nm having phosphor doped therein as impurity is formed on the oxynitride film 13 by use of the LPCVD method. The polysilicon film 14 is used as a first gate electrode (floating gate). Then, a second gate insulating film 15 with a film thickness of 120 nm is formed on the polysilicon film 14 by use of the LPCVD method. As the second gate insulating film 15, for example, a single-layered silicon oxide film, a so-called ON structure having a silicon oxide film and silicon nitride film stacked on each other, or an ONO structure having a silicon oxide film, silicon nitride film and silicon oxide film stacked on each other can be used. After this, a polysilicon film 16 having phosphor added therein as impurity is formed on the second gate insulating film 15 by use of the LPCVD method. The polysilicon film 16 is used as a second gate electrode (control gate). Then, an oxide film 17 is formed on the polysilicon film 16 by use of the LPCVD method (FIG. 7C).

Figure 7D:
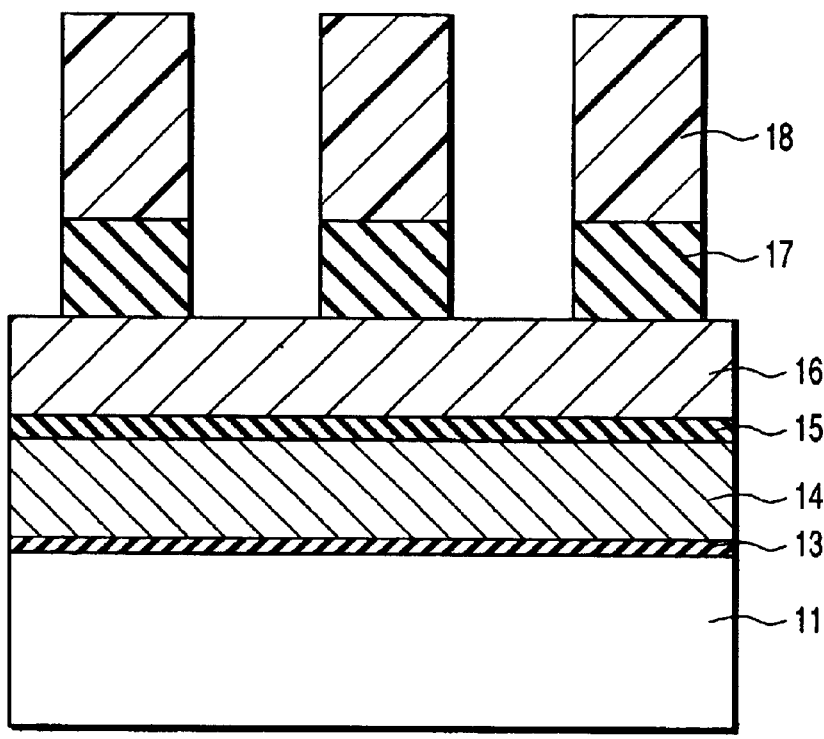

Further, a photoresist 18 is coated on the oxide film 17 and the oxide film 17 is processed into a desired pattern by use of the photoetching method (FIG. 7D).

Figure 7E:
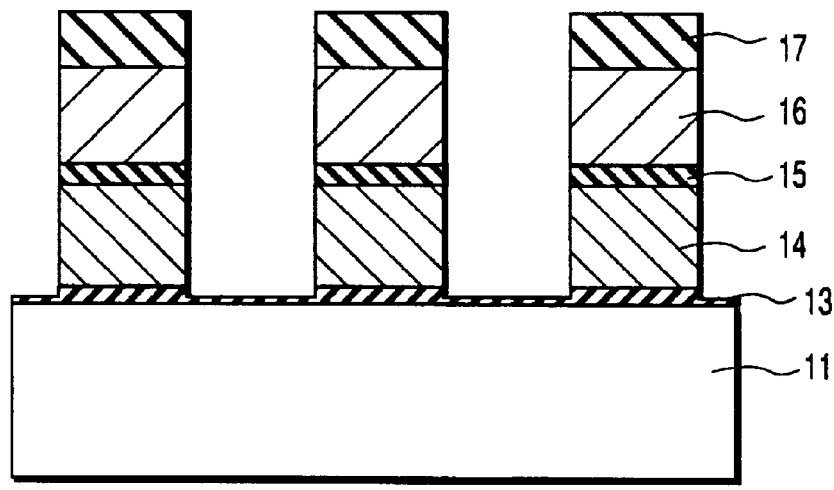

Next, the photoresist 18 is removed. The etching process is effected in a direction perpendicular to the main surface of the silicon substrate 11 by use of a dry etching method such as an RIE (Reactive Ion Etching) method with the patterned oxide film 17 used as a mask so as to sequentially form control gates 16, second gate insulating films 15 and floating gates 14 (FIG. 7E).

After this, a film with high nitrogen concentration is selectively etched by use of hot phosphoric acid (FIG. 7F). As a result, the oxynitride film 13 is removed except a portion thereof which lies under the floating gates 14 so as to expose the main surface of the silicon substrate 11.

Then, silicon oxide films (post oxidation films) 19 are formed on the exposed main surface of the silicon substrate 11 and the side walls and upper surfaces of the stacked gate structures STG by use of the thermal oxidation method (FIG. 7G).

Figure 7H:
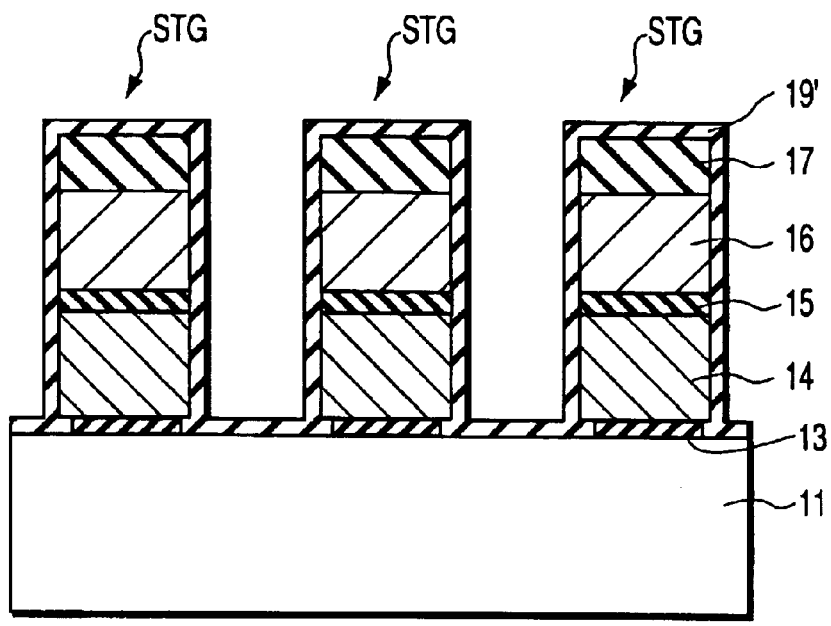

After this, the post oxidation films 19 are nitrified by use of $NH_3$ gas and then oxidized again to form oxynitride films 19' (FIG. 7H).

Figure 7I:
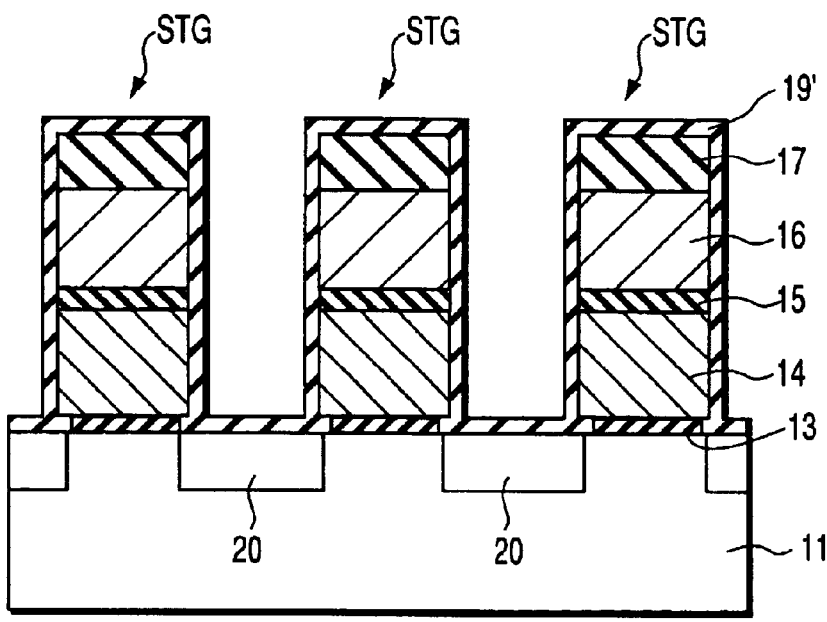

Then, in order to form source and drain regions 20, impurity is ion-implanted into the silicon substrate 11 with the stacked gate structures STG used as a mask and ion-implanted ions are activated by annealing to form cell transistors (FIG. 7I).

In this embodiment, since the oxynitride film 13 is removed by etching, it becomes easier to form the post oxidation film and a portion of the gate insulating film 13 which is damaged at the time of processing of the electrodes such as the control gates 16 and floating gates 14 can be restored. Further, as shown in FIG. 6, since an edge portion 14A of the floating gate 14 used as a first gate electrode which lies on the tunnel oxide film (oxynitride film 13) side can be rounded, concentration of the electric field can be suppressed. In addition, since the post oxidation film 19 is formed into an oxynitride form, deterioration of the gate insulating film caused by the heat treatment process in the later step can be suppressed.

Like the first embodiment, in this embodiment, hot phosphoric acid is used to remove the oxynitride film 13, but this is not limitative, and a mixed solution of hydrofluoric acid and glycerol, a mixed solution of hydrofluoric acid and ethylene glycol, a mixed solution of hydrofluoric acid and ethylene glycol mono-ethyl ether or hydrofluoric acid vapor may be used to remove the oxynitride film 13. Further, by oxynitride film 13 can be etched and removed by isotropic etching such as CDE and if the post oxidation film 19 is formed by use of a wet oxidation process, the same effect can be attained.

[Third Embodiment]

FIGS. 8A to 8G are cross sectional views partly and sequentially showing the manufacturing steps of a NAND cell type flash memory, for illustrating a method for manufacturing a semiconductor device according to a third embodiment of this invention and each corresponding to the cross section taken along the 3—3 line of the pattern plan view shown in FIG. 1.

In this embodiment, in a case where an oxynitride film is used as a gate insulating film of each cell transistor in a NAND cell type flash memory, the post oxidation process after processing electrodes (control gates and floating gates) is effected by a high-temperature wet etching process.

Figure 8A:
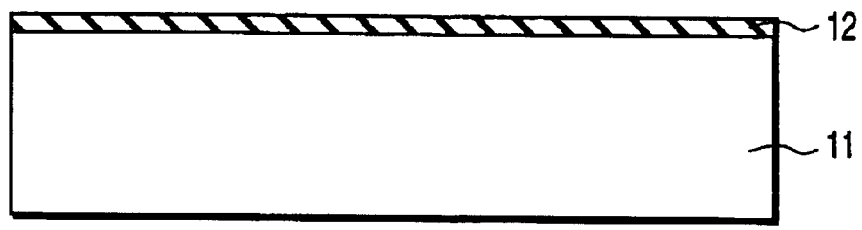
FIGS. 8A to 8G are cross sectional views sequentially showing the manufacturing steps of cell transistors in a NAND cell type flash memory, for illustrating a method for manufacturing semiconductor devices according to a third embodiment of this invention.

First, a silicon oxide film 12 with a film thickness of 7 nm, for example, is formed on a silicon substrate 11 by use of the thermal oxidation method (FIG. 8A).

Figure 8B:
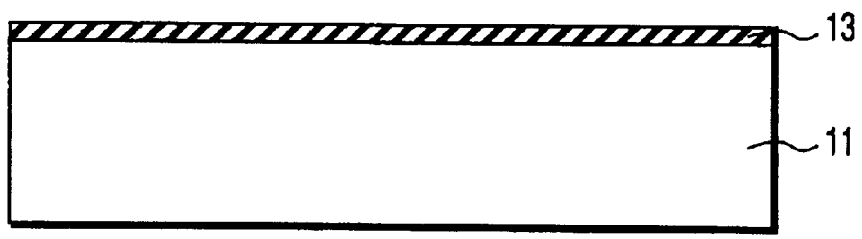

Then, an oxynitride film 13 is formed by nitrifying the silicon oxide film 12 by use of $NH_3$ gas, NO gas or $N_2O$ gas and then oxidizing the same (FIG. 8B). The oxynitride film 13 acts as a first gate insulating film (tunnel oxide film).

Figure 8C:
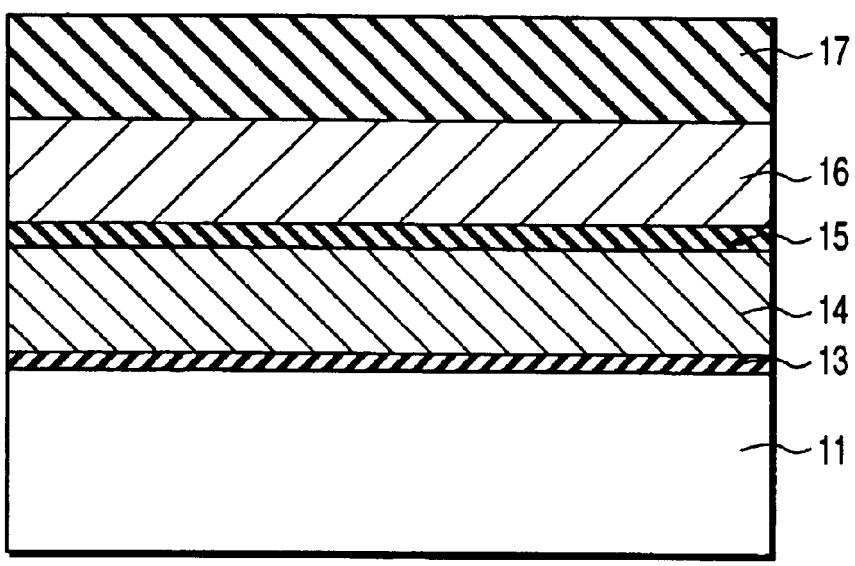

Next, a polysilicon film 14 with a film thickness of 200 nm having phosphor doped therein as impurity is formed on the oxynitride film 13 by use of the LPCVD method. The polysilicon film 14 is used as a first gate electrode (floating gate). Then, a second gate insulating film 15 with a film thickness of 120 nm is formed on the polysilicon film 14 by use of the LPCVD method. As the second gate insulating film 15, for example, a single-layered silicon oxide film, a so-called ON structure having a silicon oxide film and silicon nitride film stacked on each other, or an ONO structure having a silicon oxide film, silicon nitride film and silicon oxide film stacked on each other can be used. After this, a polysilicon film 16 having phosphor doped therein as impurity is formed on the second gate insulating film 15 by use of the LPCVD method. The polysilicon film 16 is used as a second gate electrode (control gate). Then, an oxide film 17 is formed on the polysilicon film 16 by use of the LPCVD method (FIG. 8C).

Figure 8D:
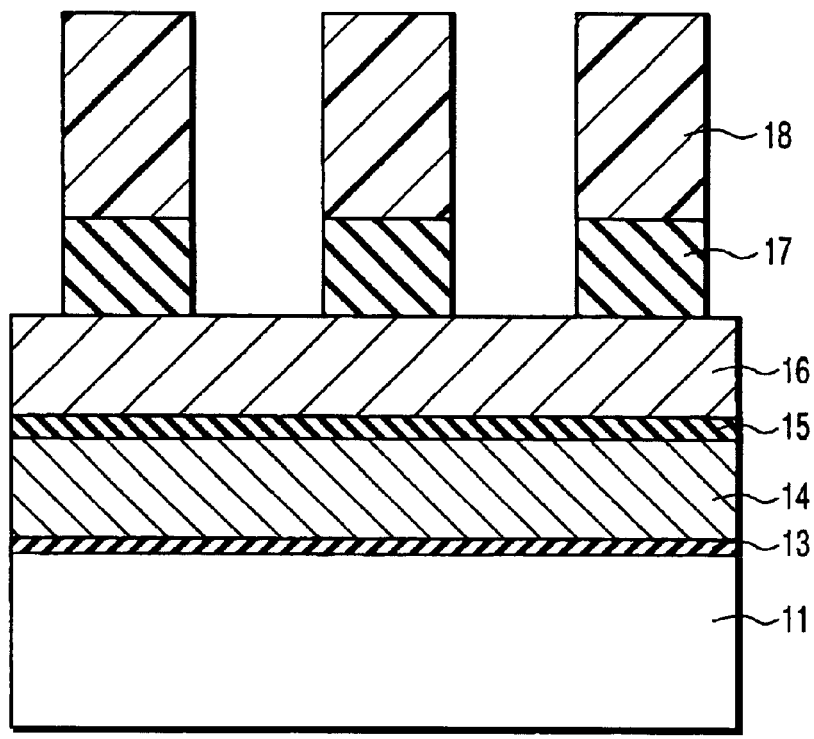

After this, a photoresist 18 is coated on the oxide film 17 and the oxide film 17 is processed into a desired pattern by use of the photoetching method (FIG. 8D).

Figure 8E:
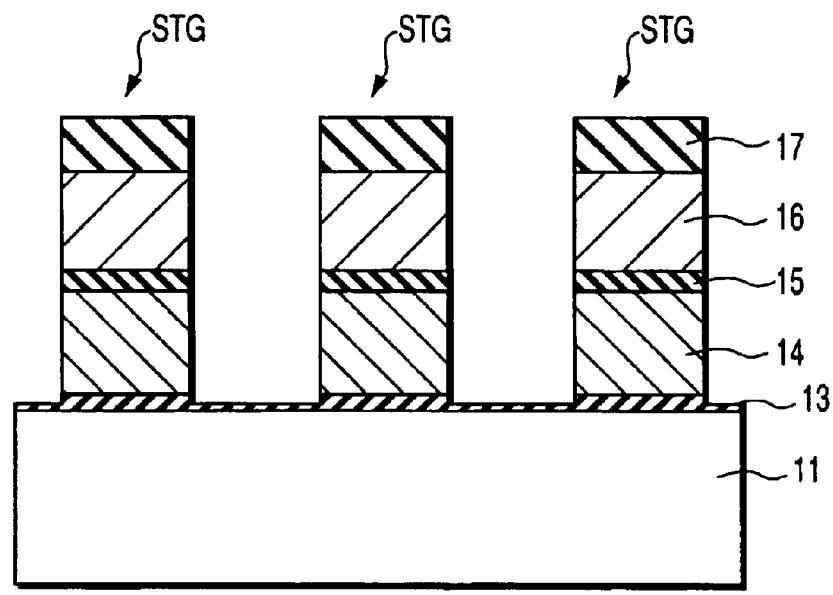

Next, the photoresist 18 is removed. The etching process is effected in a direction perpendicular to the main surface of the silicon substrate 11 by use of a dry etching method such as an RIE (Reactive Ion Etching) method with the patterned oxide film 17 used as a mask so as to sequentially form control gates 16, second gate insulating films 15 and floating gates 14 (FIG. 8E).

Figure 8F:
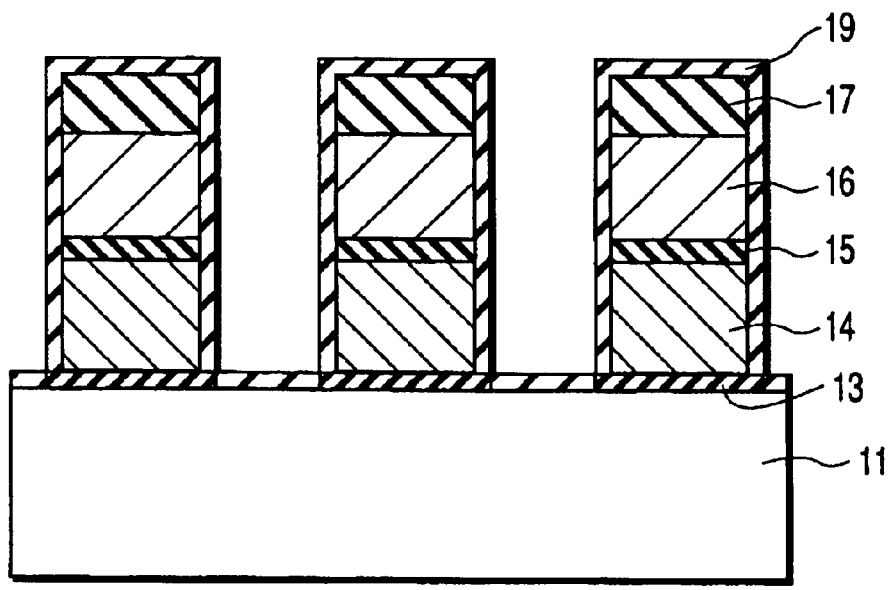

After this, silicon oxide films (post oxidation films) 19 are formed by use of a high-temperature wet etching process (FIG. 8F). At the time of formation of the silicon oxide films 19, nitrogen is extracted from part of the oxynitride film 13 which is not covered with the floating gate 14 and the nitrogen concentration of the above part is lowered.

Figure 8G:
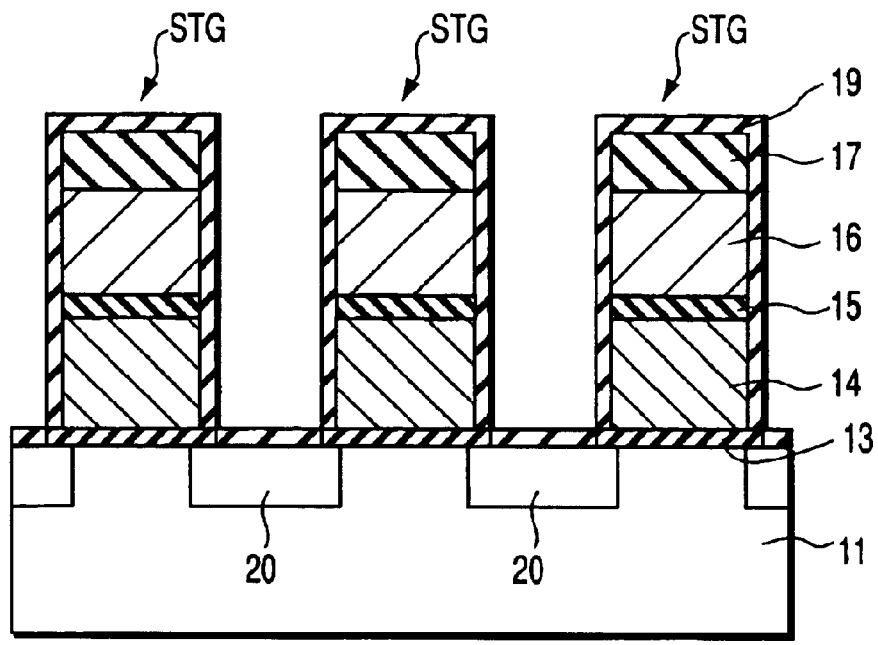

After the post oxidation films 19 are formed, impurity is ion-implanted into the silicon substrate 11 with the stacked gate structures STG used as a mask so as to form source and drain regions 20 and ion-implanted ions are activated by annealing to form cell transistors (FIG. 8G).

In this embodiment, since the nitrogen concentration of part of the oxynitride film 13 which lies on the source and drain regions 20 and is not covered with the floating gates 14 is lowered at the time of formation of the silicon oxide films 19, it becomes easier to form the post oxidation films 19. As a result, the damage portion of the gate insulating film (oxynitride film) 13 caused at the time of etching of the control gates 16 and floating gates 14 can be eliminated and an amount of electrons trapped in the gate insulating film 13 can be reduced. Further, as shown in FIG. 6 since an edge portion 14A of the floating gate 14 (first gate electrode) which lies on the tunnel oxide film 13 side can be rounded, concentration of the electric field can be suppressed.

Further, in this embodiment, the post oxidation film 13 is formed by use of the wet etching process, but the oxidation temperature used at this time may be preferably set in a range of 950° C. to 1190° C. and if the above condition is satisfied, the effect that nitrogen in the oxynitride film 13 can be extracted by approx. 30% can be attained.

Figure 9:
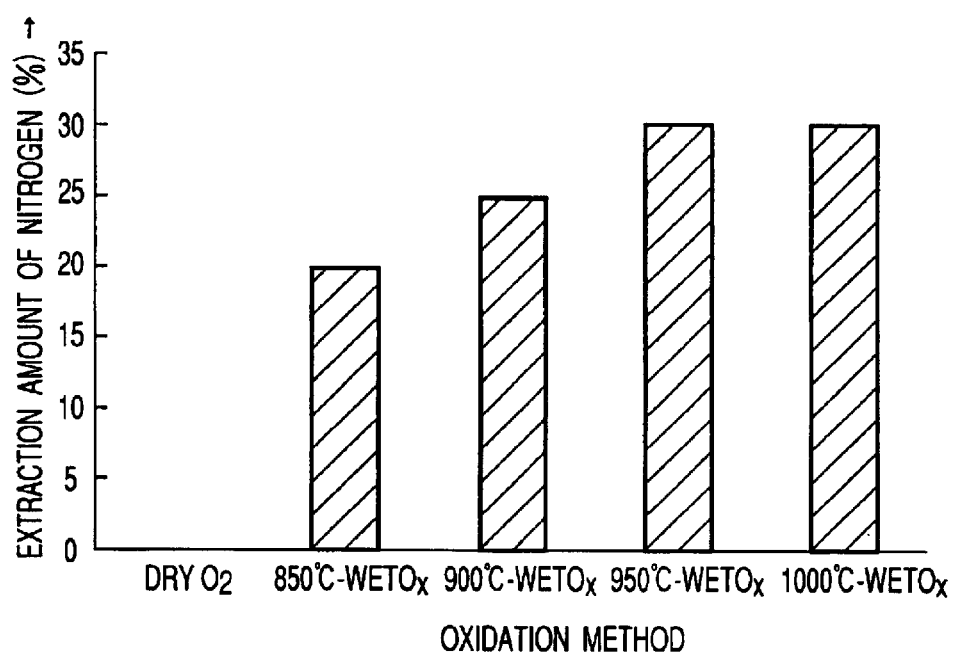
FIG. 9 is a diagram showing the relation between a nitrogen extraction amount in an oxynitride film and an oxidation method.

FIG. 9 shows the relation between an extraction amount of nitrogen in the oxynitride film 13 and can oxidation method. As is clearly seen from FIG. 9, the nitrogen extraction rate is higher in the wet oxidation process than in the dry $O_2$ oxidation process, and the nitrogen extraction amount becomes larger with a rise in the oxidation temperature in the wet oxidation process. If the oxidation temperature exceeds 950° C., it becomes possible to extract nitrogen in the oxynitride film 13 by approx. 30%. Preferably, the nitrogen concentration of the oxynitride film 13 is $3 \times 10^{15}$ atoms/cm$^2$ or less.

[Fourth Embodiment]

FIGS. 10A to 10H are cross sectional views partly and sequentially showing the manufacturing steps of a NAND cell type flash memory, for illustrating a method for manufacturing a semiconductor device according to a fourth embodiment of this invention and each corresponding to the cross section taken along the 3—3 line of the pattern plan view shown in FIG. 1.

In this embodiment, in a case where an oxynitride film is used as a gate insulating film of each cell transistor in a NAND cell type flash memory, after a post oxidation film is formed, oxynitrifying the post oxidation film by use of $NH_3$ gas, NO gas or $N_2O$ gas. Thereafter oxidizing the oxynitride film.

First, a silicon oxide film 12 with a film thickness of 7 nm, for example, is formed on a silicon substrate 11 by use of the thermal oxidation method (FIG. 10A).

Then, an oxynitride film 13 is formed by nitrifying the silicon oxide film 12 by use of $NH_3$ gas, NO gas or $N_2O$ gas and then oxidizing the same (FIG. 10B). The oxynitride film 13 acts as a first gate insulating film (tunnel oxide film).

Next, a polysilicon film 14 with a film thickness of 200 nm having phosphor doped therein as impurity is formed on the oxynitride film 13 by use of the LPCVD method. The polysilicon film 14 is used as a first gate electrode (floating gate). Then, a second gate insulating film 15 with a film thickness of 120 nm is formed on the polysilicon film 14 by use of the LPCVD method. As the second gate insulating film 15, for example, a single-layered silicon oxide film, a so-called ON structure having a silicon oxide film and silicon nitride film stacked on each other, or an ONO structure having a silicon oxide film, silicon nitride film and silicon oxide film stacked on each other can be used. After this, a polysilicon film 16 having phosphor doped therein as impurity is formed on the second gate insulating film 15 by use of the LPCVD method. The polysilicon film 16 is used as a second gate electrode (control gate). Then, an oxide film 17 is formed on the polysilicon film 16 by use of the LPCVD method (FIG. 10C).

Figure 10D:
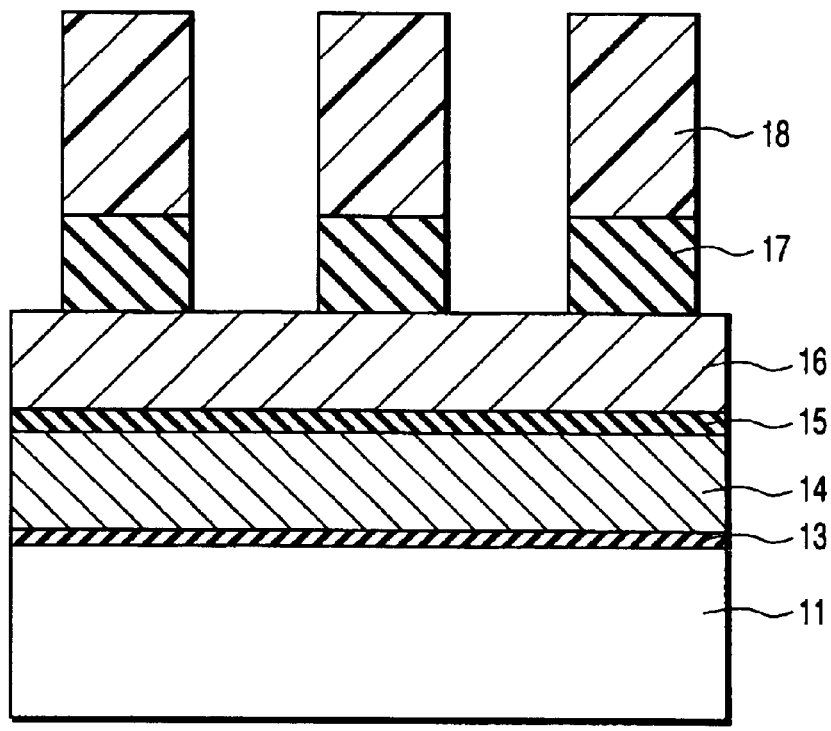

After this, a photoresist 18 is coated on the oxide film 17 and the oxide film 17 is processed into a desired pattern by use of the photoetching method (FIG. 10D).

Figure 10E:
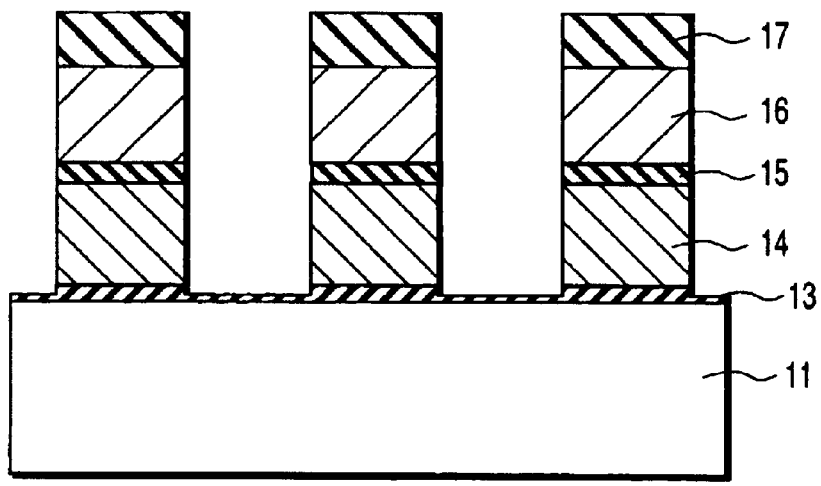

Next, the photoresist 18 is removed. The etching process is effected in a direction perpendicular to the main surface of the silicon substrate 11 by use of a dry etching method such as an RIE (Reactive Ion Etching) method with the patterned oxide film 17 used as a mask so as to sequentially form control gates 16, second gate insulating films 15 and floating gates 14 (FIG. 10E).

Figure 10F:
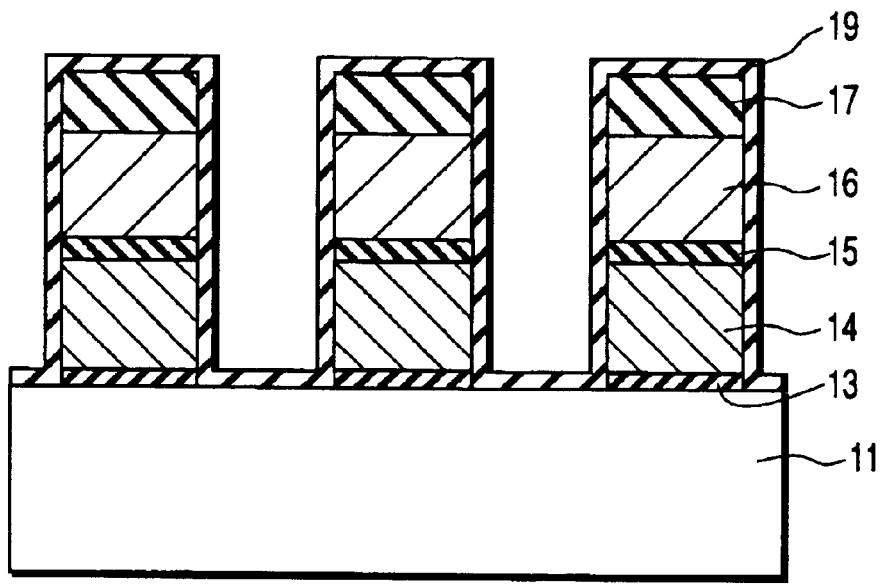

After this, silicon oxide films (post oxidation films) 19 are formed by use of an oxyhydrogen combustion method using an external combustion equipment or vaporizer method using $H_2O$ as an oxidizer (FIG. 10F).

Figure 10G:
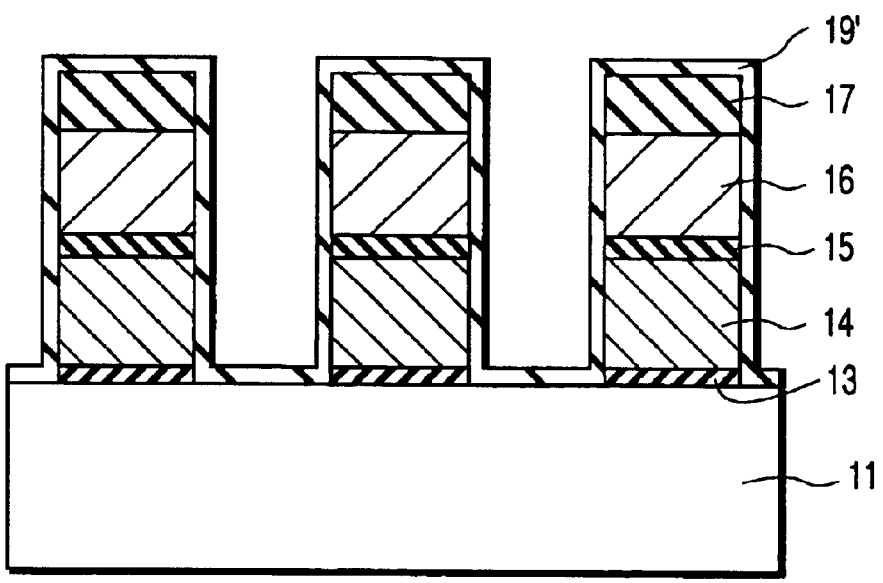

After the post oxidation films 19 are formed, the oxide films 19 are nitrified by use of $NH_3$ gas, NO gas or $N_2O$ gas to form oxynitride films 19' (FIG. 10G).

Figure 10H:
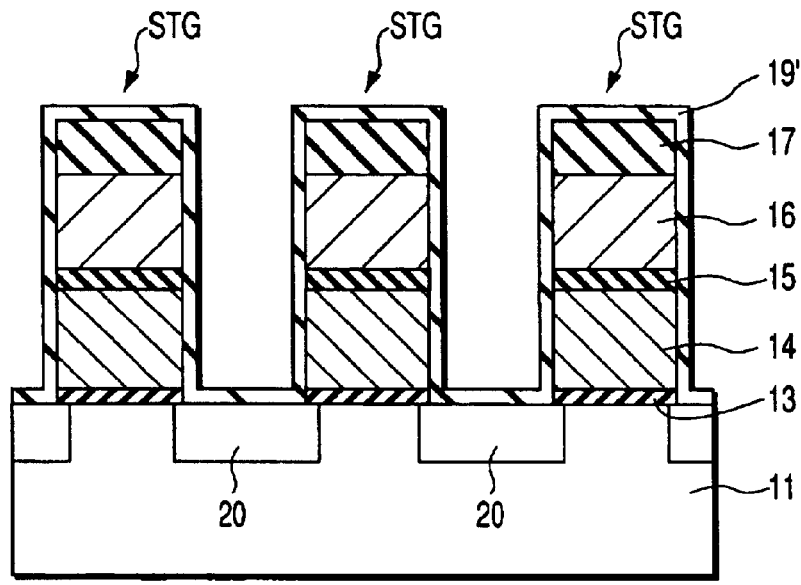

After this, impurity is ion-implanted into the silicon substrate 11 with the stacked gate structures STG used as a mask in order to form source and drain regions 20 and ion-implanted ions are activated by annealing to form cell transistors (FIG. 10H).

In this embodiment, since nitrogen can be extracted from part of the post oxidation films 19' near the edge portion 14A after the shape of the edge portion 14A of the floating gate 14 is improved by forming the post oxidation film 19 into on oxynitride form, nitrogen can be introduced again so as to reduce an amount of electrons trapped in the gate insulating film 13.

In the above fourth embodiment, a case where the post oxidation film 19 is formed by use of an oxyhydrogen combustion method using external combustion equipment or vaporizer method using $H_2O$ as an oxidizer is taken as an example is explained, but it is possible to use the wet oxidation process.

[Modification]

In the first to fourth embodiments, a case wherein the manufacturing process of the NAND cell type flash memory is taken as an example is explained, but it is of course possible to apply this invention to a manufacturing method of other semiconductor devices such as MOS transistors in the same manner as described above.

Figure 11:
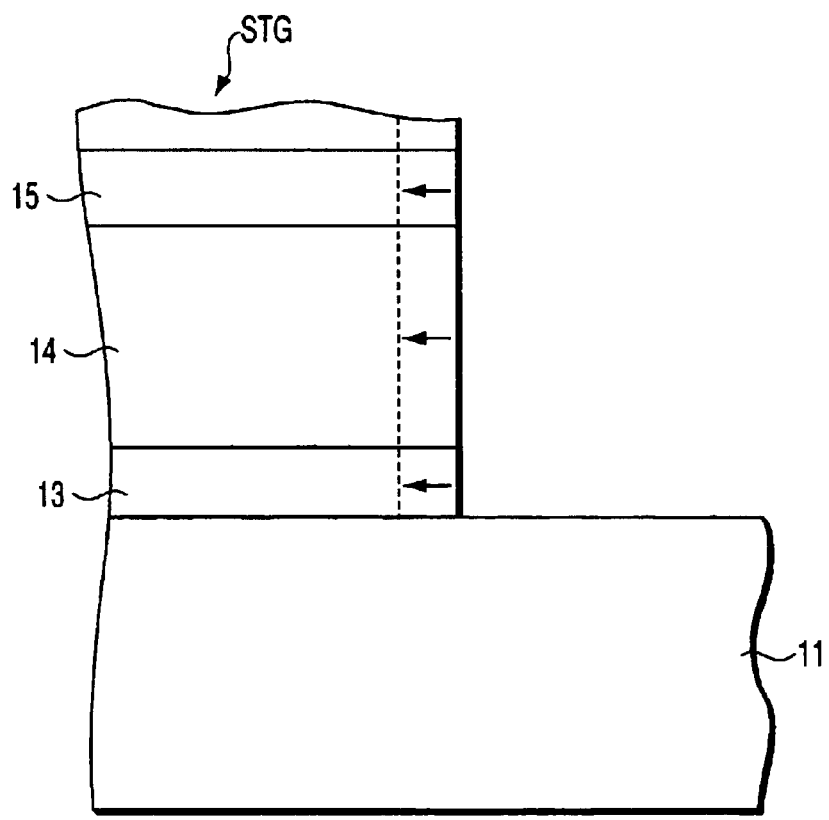
FIG. 11 is a cross sectional view showing a part of the manufacturing steps of cell transistor in a NAND cell type flash memory, for illustrating a method for manufacturing semiconductor devices according to a modification of this invention.

Further, after forming the stacked gate structure STG etched by the polysilicon film 16 the second gate insulating film 15 and the polysilicon film 14, end portions of the stacked gate structure STG are etch-backed by isotropic etching such as CDE (Chemical Dry Etching), then the end portions of the floating gate can be shift on to a no damage portion of the gate insulation film (tunnel oxidation film) as shown by a broken line in FIG. 11. Therefore, the damage caused in the gate insulating film (tunnel oxide film) 13 in the RIE process can be eliminated, and reduce the influence of the element characteristics.

As described above, according to the embodiments of this invention, it is possible to provide a semiconductor device manufacturing method capable of preventing that electrons are trapped in the gate insulating film to reduce a current amount or the electric field is concentrated on part of the gate insulating film to accelerate deterioration thereof by the presence of damage of the gate insulating film caused at the time of processing of the gate electrodes in a case where a thermal nitride film is used as the gate insulating film.

Further, it is possible to provide a semiconductor device manufacturing method in which formation of the oxidation film by the post heat treatment can be accelerated, the performances of memory cells or MOS transistors can be enhanced and the manufacturing yield and reliability can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

forming a gate insulating film in an oxynitride form on a main surface of a semiconductor substrate;

forming gate electrodes on the gate insulating film;

removing the gate insulating film except under the gate electrodes to expose the main surface of the semiconductor substrate;

forming an insulating film on the exposed main surface of the semiconductor substrate by at least one of a vaporizer method using $H_2O$ as an oxidizer, an oxyhydrogen combustion method, and a wet oxidation method performed at temperatures not lower than 950° C.; and forming impurity diffused layers on both sides of the respective gate electrodes in the semiconductor substrate.

2. The semiconductor device manufacturing method according to claim 1, wherein said forming the gate insulating film includes thermally oxidizing the main surface of the semiconductor substrate to form an oxide film, nitrifying the oxide film, and oxidizing the nitrified oxide film again.

3. The semiconductor device manufacturing method according to claim 1, wherein said removing the gate insulating film except under the gate electrodes is effected by using at least one of hot phosphoric acid, a mixed solution of hydrofluoric acid and glycerol, a mixed solution of hydrofluoric acid and ethylene glycol, a mixed solution of hydrofluoric acid and ethylene glycol mono-ethyl ether and hydrofluoric acid vapor.

4. The semiconductor device manufacturing method according to claim 1, wherein said removing the gate insulating film except under the gate electrodes is effected by use of an isotropic etching process.

5. The semiconductor devices manufacturing method according to claim 1, further comprising nitrifying the insulating film.

6. A semiconductor device manufacturing method comprising:

forming a gate insulating film in an oxynitride form on a main surface of a semiconductor substrate;

forming gate electrodes on the gate insulating film;

making a nitrogen concentration of part of the gate insulating film except under the gate electrodes lower than a nitrogen concentration of part of the gate insulating film which lies under the gate electrodes by oxidizing the gate electrodes and the gate insulating film by at least one of a vaporizer method using $H_2O$ as an oxidizer, an oxyhydrogen combustion method, and a wet oxidization method performed at temperatures not lower than 950° C.; and forming impurity diffused layers on both sides of the respective gate electrodes in the semiconductor substrate.

7. A semiconductor devices manufacturing method comprising:

forming a gate insulating film in an oxynitride forms on a main surface of a semiconductor substrate;

forming gate electrodes on the gate insulating film;

forming a post oxidation film on the main surface of the semiconductor substrate except under the gate electrodes by at least one of a vaporizer method using $H_2O$ as an oxidizer, an oxyhydrogen combustion method, and a wet oxidization method performed at temperatures not lower than 950° C.;

oxynitrifying the post oxidation film; and forming impurity diffused layers on both sides of the respective gate electrodes in the semiconductor substrate.

8. A semiconductor device manufacturing method comprising:

forming a first insulating film in an oxynitride form on a main surface of a semiconductor substrate;

forming a first conductive layer on the first insulating film;

forming a second insulating film on the first conductive layer;

forming a second conductive layer on the second insulating film;

forming a third insulating film on the second conductive layer;

patterning the third insulating film to form a mask;

etching the second conductive layer, second insulating film and first conductive layer with the third insulating film used as a mask to form stacked gate structures each having a control gate, second gate insulating film and floating gate;

removing part of the first insulating film which lies on the main surface of the semiconductor substrate and is disposed between the attached gate structures to expose the main surface of the semiconductor substrate and leave another part of the first insulating film which lies under the stacked gate structures, each part of the first insulating film which is left behind under the stacked gate structures acting as a first gate insulating film;

forming a fourth insulating film on side walls and upper surfaces of the stacked gate structures and the exposed main surface of the semiconductor substrate by at least one of a vaporizer method, an oxyhydrogen combustion method, and a wet oxidation method performed at temperatures not lower than 950° C.; and doping impurity into the main surface of the semiconductor substrate with the stacked gate structures used as a mask to form source and drain regions.

9. The semiconductor device manufacturing method according to claim 8, wherein said forming the first insulating film includes thermally oxidizing the main surface of the semiconductor substrate to form an oxide film, nitrifying the oxide film, and oxidizing the nitrified oxide film again.

10. The semiconductor device manufacturing method according to claim 8, wherein said removing part of the first insulating film is effected by using at least one of hot phosphoric acid, a mixed solution of hydrofluoric acid and glycerol, a mixed solution of hydrofluoric acid and ethylene glycol, a mixed solution of hydrofluoric acid and ethylene glycol mono-ethyl ether and hydrofluoric acid vapor.

11. The semiconductor device manufacturing method according to claim 8, wherein said removing part of the first insulating film which is effected by use of an isotropic etching process.

12. The semiconductor device manufacturing method according to claim 8, wherein said forming the fourth insulating film includes forming oxide films on the side walls and upper surfaces of the stacked gate structures and the exposed main surface of the semiconductor substrate.

13. The semiconductor device manufacturing method according to claim 8, wherein said forming the fourth insulating film includes forming oxide films on the side walls and upper surfaces of the stacked gate structures and the exposed main surface of the semiconductor substrate, nitrifying the oxide film, and oxidizing the nitrified oxide film again.

14. A semiconductor device manufacturing method comprising:
   forming a first insulating film in an oxynitride form on a main surface of a semiconductor substrate;
   forming a first conductive layer on the first insulating film;
   forming a second insulating film on the first conductive layer;
   forming a second conductive layer on the second insulating film;
   forming a third insulating film on the second conductive layer;
   patterning the third insulating film to form a mask;
   etching the second conductive layer, second insulating film and first conductive layer with the third insulating film used as a mask to form stacked gate structures each having a control gate, second gate insulating film and floating gate, each part of the first insulating film which lies under the stacked gate structures acting as a first gate insulating film;
   making a nitrogen concentration of the first insulating film which is disposed between the respective stacked gate structures lower than a nitrogen concentration of the first insulating film which lies under the stacked gate structures by oxidizing the stacked gate structures and the first insulating film disposed between the respective stacked gate structures by at least one of a vaporizer method, an oxyhydrogen combustion method, and a wet oxidation method performed at temperatures not lower than 950° C.; and
   doping impurity into the main surface of the semiconductor substrate with the stacked gate structures used as a mask to form source and drain regions.

15. A semiconductor device manufacturing method comprising:
   forming a first insulating film in an oxynitride form on a main surface of a semiconductor substrate;
   forming a first conductive layer on the first insulating film;
   forming a second insulating film on the first conductive layer;
   forming a second conductive layer on the second insulating film;
   forming a third insulating film on the second conductive layer;
   patterning the third insulating film to form a mask;
   etching the second conductive layer, second insulating film and first conductive layer with the third insulating film used as a mask to form stacked gate structures each having a control gate, second gate insulating film and floating gate;
   removing part of the first insulating film which lies on the main surface of the semiconductor substrate and is disposed between the stacked gate structures to expose the main surface of the semiconductor substrate and leave another part of the first insulating film under the stacked gate structures, each part of the first insulating film which is left behind under the stacked gate structures acting as a first gate insulating film;
   forming a post oxidation film on said walls and upper surfaces of the stacked gate structures and the exposed main surface of the semiconductor substrate by at least one of a vaporizer method, an oxyhydrogen combustion method, and a wet oxidation method performed at temperatures not lower than 950° C.;
   oxynitrifying the post oxidation film; and
   doping impurity into the main surface of the semiconductor substrate with the stacked gate structures used as a mask to form source and drain regions.

* * * * *